(12) United States Patent
Yu

(10) Patent No.: US 11,818,919 B2
(45) Date of Patent: Nov. 14, 2023

(54) DISPLAY DEVICE

(71) Applicant: LG Display Co., Ltd., Seoul (KR)

(72) Inventor: GwanMin Yu, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/971,398

(22) Filed: Oct. 21, 2022

(65) Prior Publication Data

US 2023/0180574 A1    Jun. 8, 2023

(30) Foreign Application Priority Data

Dec. 2, 2021   (KR) .................. 10-2021-0170621

(51) Int. Cl.
| | |
|---|---|
| *H10K 59/122* | (2023.01) |
| *G06F 3/044* | (2006.01) |
| *H10K 59/40* | (2023.01) |
| *H10K 50/84* | (2023.01) |
| *H10K 59/131* | (2023.01) |
| *G06F 3/041* | (2006.01) |
| *H10K 59/126* | (2023.01) |

(52) U.S. Cl.
CPC ......... *H10K 59/122* (2023.02); *G06F 3/0412* (2013.01); *G06F 3/0446* (2019.05); *G06F 3/04164* (2019.05); *H10K 50/84* (2023.02); *H10K 59/126* (2023.02); *H10K 59/131* (2023.02); *H10K 59/40* (2023.02); *G06F 2203/04107* (2013.01)

(58) Field of Classification Search
CPC .... H10K 59/40; H10K 59/122; H10K 59/131; H10K 59/126; H10K 50/84; G06F 3/0446; G06F 3/0412; G06F 3/04164; G06F 3/0443; G06F 2203/04107

See application file for complete search history.

(56) References Cited

U.S. PATENT DOCUMENTS

| | | | |
|---|---|---|---|
| 10,147,776 B2 * | 12/2018 | Nam | H10K 59/38 |
| 11,036,325 B2 | 6/2021 | Lee et al. | |
| 11,392,234 B2 | 7/2022 | Lee et al. | |
| 2016/0349565 A1 * | 12/2016 | Kim | G02F 1/13306 |
| 2019/0172893 A1 * | 6/2019 | Lee | H10K 59/1275 |
| 2021/0064172 A1 | 3/2021 | Lee et al. | |
| 2021/0217835 A1 | 7/2021 | Park et al. | |
| 2021/0263608 A1 | 8/2021 | Lee et al. | |
| 2023/0131822 A1 * | 4/2023 | Choi | H10K 59/1213 257/71 |

FOREIGN PATENT DOCUMENTS

| | | |
|---|---|---|
| EP | 3848990 A1 | 7/2021 |
| KR | 10-2021-0026454 A | 3/2021 |
| KR | 10-2022-0090183 A | 6/2022 |

OTHER PUBLICATIONS

Intellectual Property Office of the United Kingdom, Office Action, GB Patent Application No. 2216069.1, dated May 16, 2023, five pages.

\* cited by examiner

*Primary Examiner* — Darlene M Ritchie

(74) *Attorney, Agent, or Firm* — Fenwick & West LLP

(57) ABSTRACT

The present disclosure relates to a display device, interference which may be generated by the shielding layer in the display device is reduced to minimize the noise.

19 Claims, 5 Drawing Sheets

DISPLAY DEVICE

CROSS-REFERENCE TO RELATED APPLICATIONS

This application claims the priority of Korean Patent Application No. 10-2021-0170621 filed on Dec. 2, 2021, in the Korean Intellectual Property Office, the disclosure of which is incorporated herein by reference.

BACKGROUND

Field

The present disclosure relates to a display device, and more particularly, to a display device in which a bezel size is reduced without causing a signal interference between a gate driving circuit and a touch routing line.

Description of the Related Art

As the information society develops, demands for display devices which display images is increasing and various types of display devices such as a liquid crystal display device or an organic light emitting display device are utilized.

In order to provide more various functions to users, such a display device provides a function of recognizing a touch on a display panel of a user and performing input processing based on the recognized touch.

For example, a display device which is capable of recognizing a touch includes a plurality of touch electrodes which are disposed or embedded in the display panel and drives the touch electrode to detect the presence of the touch of the user for the display panel or a touch coordinate.

SUMMARY

An object to be achieved by the present disclosure is to provide a display device which reduces a noise of a touch sensing signal due to a signal interference between a gate driving circuit and a touch routing line.

Another object to be achieved by the present disclosure is to provide a display device which achieves a narrow bezel by reducing an area of a non-active area.

Objects of the present disclosure are not limited to the above-mentioned objects, and other objects, which are not mentioned above, can be clearly understood by those skilled in the art from the following descriptions.

According to an aspect of the present disclosure, a display device includes a substrate which includes an active area including a plurality of pixels and a non-active area which is located to enclose the active area and has a gate driving circuit connected to each pixel, a low potential voltage line which is disposed to be closer to an outside of the substrate than the gate driving circuit, a connection line which is disposed on the gate driving circuit and is electrically connected to the low potential voltage line, a bank layer which is disposed on the connection line and includes an opening which exposes a partial area of the connection line, a cathode which is disposed on the bank layer and is in contact with the connection line in the opening, a spacer having an inverted tapered shape which is disposed on the bank layer to be closer to the outside of the substrate than the opening, and a shielding layer which is disposed so as to overlap the gate driving circuit on the bank layer. Accordingly, a signal interference which may be caused in the display device may be reduced by a shielding layer to minimize the noise.

According to another aspect of the present disclosure, a display device includes a substrate which includes an active area including a plurality of pixels and a non-active area which is located to enclose the active area and has a gate driving circuit connected to each pixel, a bank layer which defines a plurality of pixels on the active area and is formed on the non-active area, a cathode formed on the plurality of pixels and the bank layer, a spacer having an inverted tapered shape formed on the bank layer of the non-active area, and a shielding layer which is formed by a part of the cathode isolated by the spacer to be formed on the bank layer of the non-active area. Accordingly, the cathode is isolated by the spacer to form the shielding layer so that a signal interference which may be caused in the display device may be reduced.

According to the present disclosure, a signal interference which may be caused in the display device may be reduced by a shielding layer.

Further, according to the present disclosure, a bezel size may be reduced by reducing a size of a non-active area of the display device.

Other detailed matters of the exemplary embodiments are included in the detailed description and the drawings.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
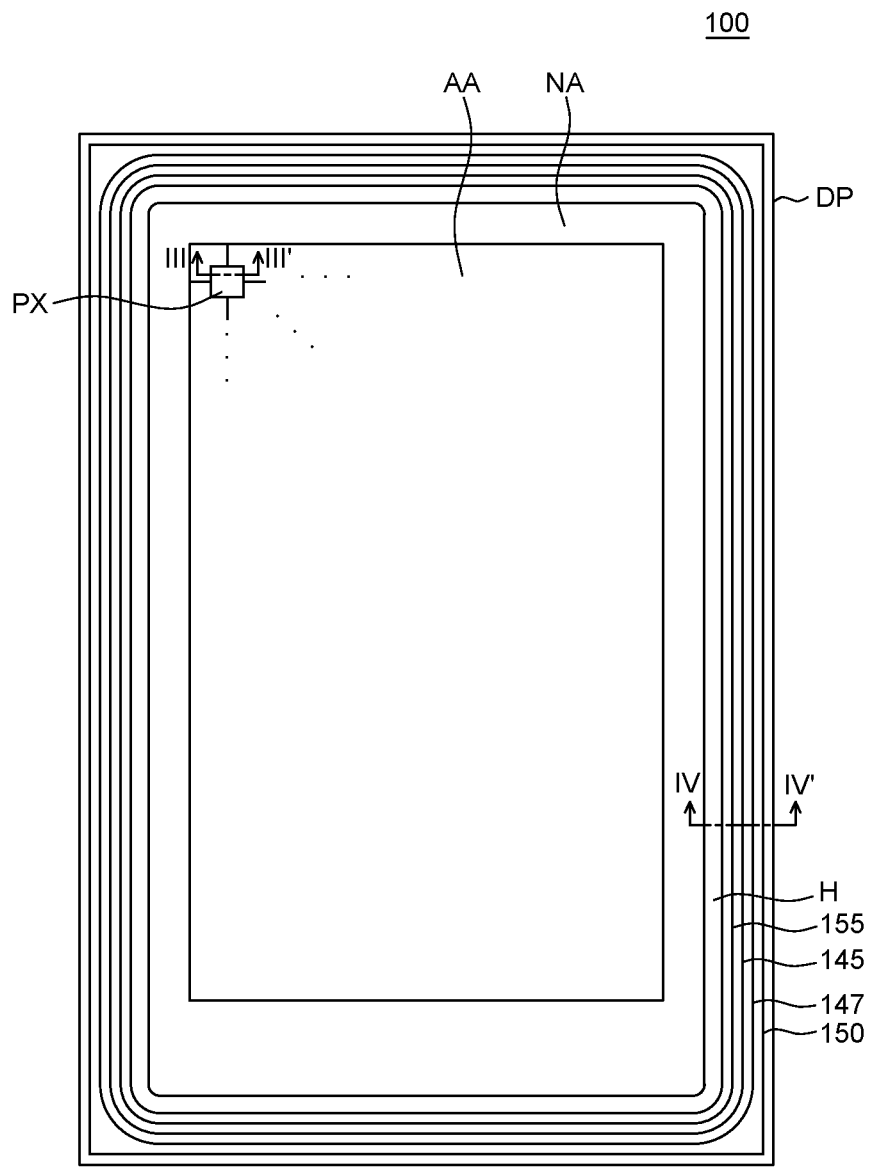
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a schematic plan view of a display device 100 according to an exemplary embodiment of the present disclosure.

Referring to FIG. 1, a display device 100 includes a display panel DP.

The display panel DP includes a substrate using glass or plastic and a plurality of gate lines and a plurality of data lines disposed on the substrate to intersect each other. A plurality of pixels PX are defined at intersections of the plurality of gate lines and data lines. An area in which a plurality of pixels implementing images is disposed is referred to as an active area AA and an area disposed at the outside of the active area AA in which the plurality of pixels PX are not disposed is referred to as a non-active area NA.

In the active area AA, a display unit for displaying images and a circuit unit for driving the display unit may be disposed. For example, when the display device 100 is an organic light emitting display device, the display unit may include a light emitting diode. The display unit may include an anode, an organic light emitting layer on the anode, and a cathode on the organic light emitting layer. For example, the organic light emitting layer may be configured by a hole transport layer, a hole injection layer, an organic emission layer, an electron injection layer, and an electron transport layer. However, when the display device 100 is a liquid crystal display device, the display unit may be configured to include a liquid crystal layer. Hereinafter, for the convenience of description, it is assumed that the display device 100 is an organic light emitting display device, but is not limited thereto.

The circuit unit may include various transistors, capacitors, and wiring lines for driving the light emitting diode. For example, the circuit unit may include various components such as a driving transistor, a switching transistor, a storage capacitor, a gate line, and a data line, but is not limited thereto.

The non-active area NA is an area where no image is displayed and various wiring lines and circuits for driving the display unit disposed in the active area AA are disposed.

The non-active area NA may be defined as an area which encloses the active area AA as illustrated in FIG. 1. but it is not limited thereto and the non-active area NA may be defined as an area extending from the active area AA. Further, the non-active area NA may be defined to extend from a plurality of sides of the active area AA.

In the non-active area NA, a COF or an FPCB in which various ICs such as a gate driver IC and a data driver IC and driving circuits are disposed may be disposed. Further, in the non-active area NA, a driving circuit referred to as a gate in panel (GIP) may be disposed.

For example, as illustrated in FIG. 1, the non-active area NA encloses the active area AA so that components disposed in the active area AA are also disposed to extend. Specifically, a connection line 147 extending from the anode of the active area AA, a bank layer 150 which is disposed on the connection line 147 and includes an opening H exposing a partial area of the connection line 147, a shielding layer 145 which is disposed on the bank layer 150 and extends from the cathode of the active area AA, and a spacer 155 which is disposed on the bank layer 150, at the outside of the substrate 101 from the opening H may be disposed. Components disposed in the non-active area NA will be described in more detail with reference to FIG. 4.

Hereinafter, the touch panel of the display device 100 according to the exemplary embodiment of the present disclosure will be described in more detail with reference to FIG. 2 together.

Figure 2:
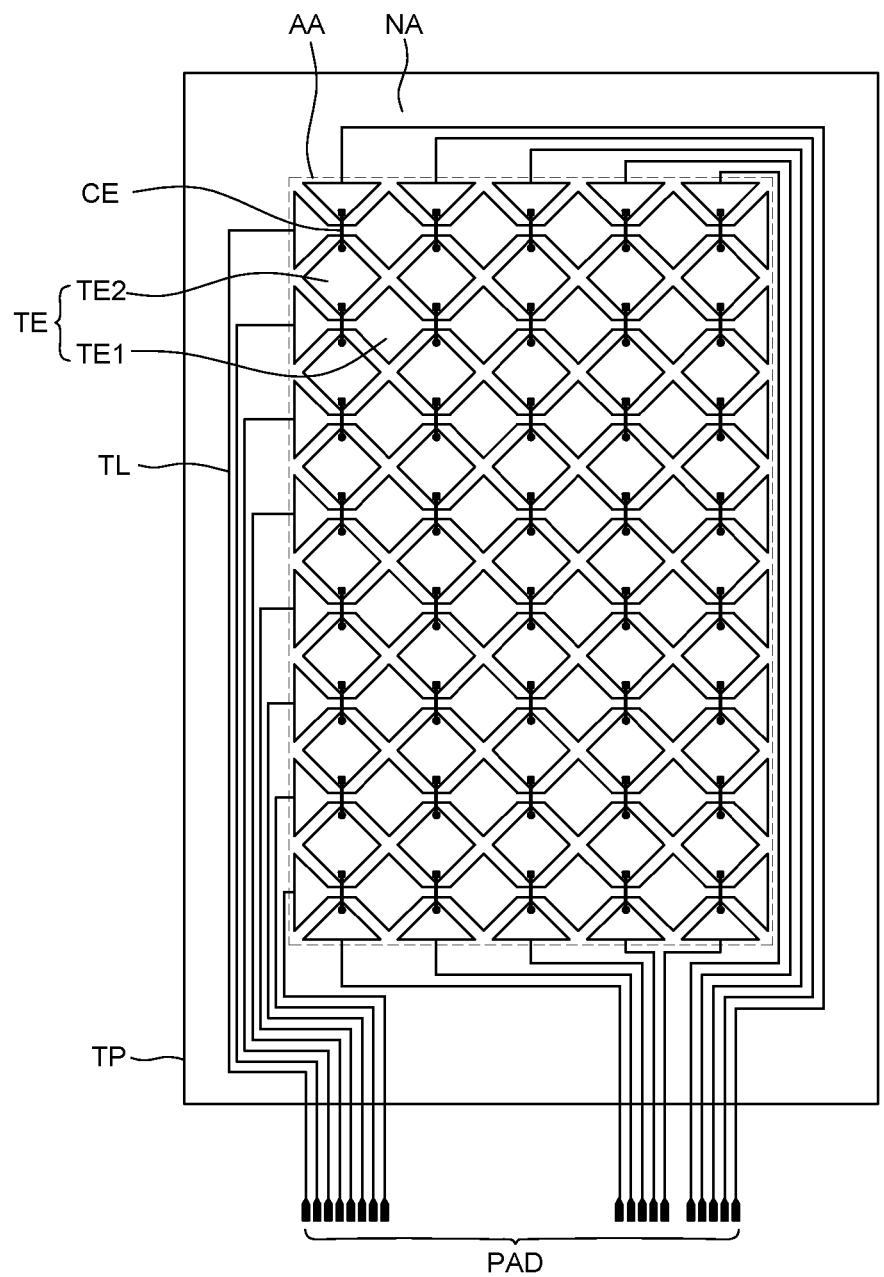
FIG. 2 is a plan view schematically illustrating a touch panel of a display device according to an exemplary embodiment of the present disclosure.

FIG. 2 is a plan view schematically illustrating a structure of a touch panel TP which is applicable to a display device according to an exemplary embodiment of the present disclosure.

The touch panel TP senses a touch input of a user. Specifically, the touch panel TP is referred to as a touch sensing unit.

The touch panel TP may be manufactured separately from the display panel DP to be attached onto the display panel DP as an add-on type or may be embedded in the display panel DP.

Specifically, when the touch panel TP is separately manufactured from the display panel DP to be attached onto the display panel DP in an add-on type, the touch panel TP may be attached to the display panel DP by means of an adhesive layer. However, a shape of the touch panel TP is not limited to the above-described type, but may vary depending on the necessity of the design.

The touch panel TP further includes a touch driver which supplies a touch driving signal to the touch panel TP and detects a touch sensing signal from the touch panel TP.

The touch driver determines the presence of the user's touch and a touch position. That is, when the user touches a partial area of the touch panel TP, the touch driver senses a touch signal to determine whether the user touches the touch panel TP and a touch position.

Specifically, the touch driver supplies the touch driving signal to each touch panel TP. The touch driver is applied with a touch sensing signal from the touch panel TP. The touch driver may sense the touch in the touch panel TP by the touch sensing signal.

The touch panel TP includes a plurality of touch electrodes TE including a plurality of first touch electrodes TE1 and a plurality of second touch electrodes TE2, a plurality of touch routing lines TL, and a plurality of touch pads PAD.

The plurality of first touch electrodes TE1 may be touch driving electrodes and the plurality of second touch electrodes TE2 may be touch sensing electrodes. The plurality of first touch electrodes TE1 are connected in a row direction to form a plurality of electrode rows and the plurality of second touch electrodes TE2 are connected in a vertical direction by the connection electrode CE to form a plurality of electrode columns.

The first touch electrode TE1 and the second touch electrode TE2 may be disposed on the same layer. However, in an area where the first touch electrodes TE1 and the second touch electrodes TE2 intersect, the second touch electrodes TE2 are disposed to be separated and the separated second touch electrodes TE2 may be connected by the connection electrode CE.

At this time, the first touch electrodes TE1, the second touch electrodes TE2, and the connection electrodes CE are disposed in an area corresponding to the active area AA of the display panel DP.

An outer appearance of the first touch electrode TE1 and the second touch electrode TE2 may correspond to a specific shape. For example, as illustrated in FIG. 2, the outer appearance of the first touch electrode TE1 and the second touch electrode TE2 may have a mesh pattern including a plurality of rhombus shapes. The first touch electrode TE1 and the second touch electrode TE2 may be formed of a metal including at least one of titanium (Ti), aluminum (Al), molybdenum (Mo), molytitanium (MoTi), copper (Cu), and tantalum (Ta) or formed of a transparent conductive material such as indium tin oxide (ITO) or indium zinc oxide (IZO). However, they are not limited thereto. Light emitted from the display device 100 passes through the first touch electrode TE1 and the second touch electrode TE2 formed of a transparent conductive material to be emitted to the outside. However, it is not limited thereto so that light emitted from the display device 100 may be emitted to the outside by means of a plurality of openings included in the first touch electrode TE1 and the second touch electrode TE2.

The non-active area NA is an area enclosing the active area AA and in the non-active area, a plurality of touch routing lines TL and a plurality of touch pads PAD are disposed.

Each of the plurality of touch routing lines TL electrically connects each of the plurality of touch electrodes TE disposed in the active area AA and the touch pad PAD of the non-active area NA. For example, a touch driving signal is applied to the first touch electrode TE1 by means of a touch routing line TL connected to the first touch electrode TE1 and a touch sensing signal is transmitted to the second touch electrode TE2 by means of a touch routing line TL connected to the second touch electrode TE2.

Such a touch routing line TL may be formed of a low resistive metal material and is also formed of a transparent conductive material such as ITO or IZO, but is not limited thereto. For example, when the plurality of touch routing lines TL are formed of a low resistive metal material, the resistance thereof is degraded so that the RC delay may be degraded.

One ends of the plurality of touch pads PAD are connected to the touch routing lines TL and the other ends are connected to an external circuit such as a touch driver to receive the touch signal from the external circuit or transmit the touch sensing signal to the external circuit.

At this time, the plurality of touch routing lines TL and the plurality of touch pads PAD are disposed in an area corresponding to the non-active area NA of the display panel DP.

Here, a cross-sectional structure of the active area AA of the display device 100 will be described in more detail with reference to FIG. 3.

Figure 3:
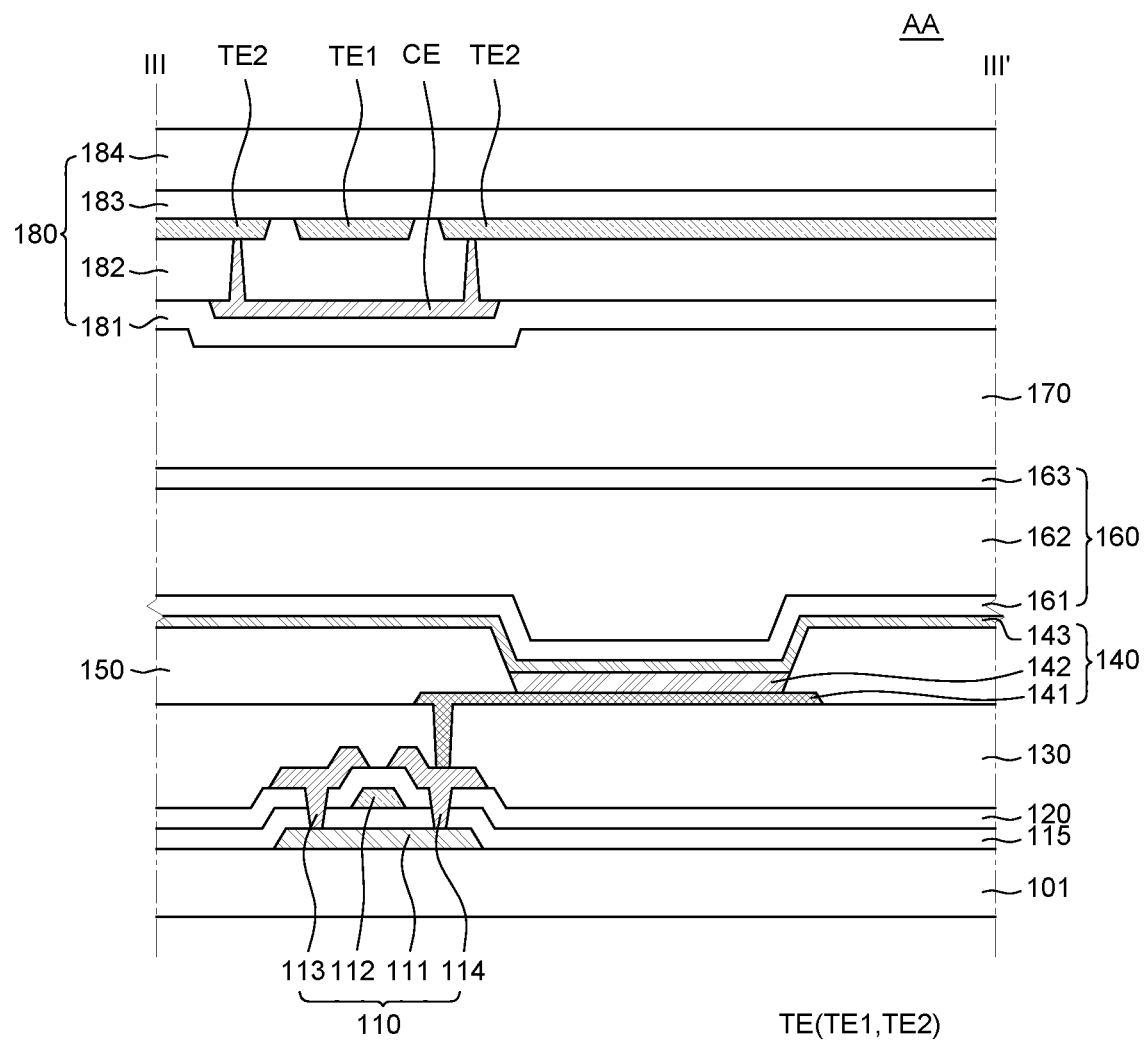
FIG. 3 is a schematic cross-sectional view taken along the line III-III' of FIG. 1.

FIG. 3 is a schematic cross-sectional view taken along the line III-III' of FIG. 1. Specifically, FIG. 3 is a cross-sectional view illustrating one pixel PX of the active area AA of the display device 100 according to the exemplary embodiment of the present disclosure.

Referring to FIG. 3, the substrate 101 supports various components of the display device 100. The substrate 101 may be formed of a transparent insulating material, for example, an insulating material, such as glass or plastic.

In the active area AA of the substrate 101, the transistor 110 which drives each pixel is disposed. The transistor 110 includes an active layer 111, a gate electrode 112, a source electrode 113, and a drain electrode 114.

The active layer 111 is disposed on the substrate 101. The active layer 111 may be formed of polysilicon (p-Si), amorphous silicon (a-Si), or oxide semiconductor, but is not limited thereto.

The gate insulating layer 115 is disposed on the substrate 101 and the active layer 111. The gate insulating layer 115 may be formed of silicon oxide SiOx, silicon nitride SiNx, or multiple layers thereof.

The gate electrode 112 is disposed on the gate insulating layer 115. The gate electrode 112 is disposed on the gate insulating layer 115 so as to overlap the active layer 111. The gate electrode 112 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

An interlayer insulating layer 120 is disposed on the gate insulating layer 115 and the gate electrode 112. The interlayer insulating layer 120 may be formed of silicon oxide SiOx, silicon nitride SiNx, or multiple layers thereof.

The source electrode 113 and the drain electrode 114 are disposed on the interlayer insulating layer 120. The source electrode 113 and the drain electrode 114 are electrically connected to the active layer 111 through the contact holes formed in the gate insulating layer 115 and the interlayer insulating layer 120. The source electrode 113 and the drain electrode 114 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

Even though it is not illustrated, a buffer layer may be located between the substrate 101 and the transistor 110, specifically, between the substrate 101 and the active layer 111. The buffer layer is a layer for protecting the transistor from impurities such as alkali ions leaked from the substrate 101 or layers therebelow. The buffer layer may be formed of silicon oxide SiOx, silicon nitride SiNx, or multiple layers thereof.

A planarization layer 130 is disposed on the transistor 110. The planarization layer 130 protects the transistor 110 and planarizes an upper portion of the transistor 110. For example, the planarization layer 130 may be formed of an organic insulating layer such as benzocyclobutene (BCB) or acryl, but is not limited thereto.

The light emitting diode 140 is disposed on the planarization layer 130. The light emitting diode 140 includes an anode 141, an organic light emitting layer 142, and a cathode 143.

The anode 141 is formed on the planarization layer 130 so as to correspond to an emission area of each pixel. The anode 141 is electrically connected to the drain electrode 114 of the transistor 110 by means of a contact hole of the planarization layer 130. The anode 141 may be configured by a metallic material having a high work function. When the display device 100 is a top emission type, the anode 141 may further include a transparent conductive layer and a reflective layer on the transparent conductive layer. The transparent conductive layer may be formed of transparent conductive oxide such as ITO or IZO and the reflective layer is formed of silver (Ag), aluminum (Al), gold (Au), molybdenum (Mo), tungsten (W), chrome (Cr), or an alloy thereof.

A bank layer 150 is formed in a remaining area excluding an emission area. Therefore, the bank layer 150 exposes the anode 141 corresponding to the emission area. The bank layer 150 may be formed of an inorganic insulating material, such as a silicon nitride film (SiNx) or a silicon oxide film (SiOx), or an organic insulating material, such as benzocyclobutene (BCB), acrylic resin or imide resin, but is not limited thereto.

Even though it is not illustrated, a spacer may be further formed on the bank layer 150. The spacer may be formed of the same material as the bank layer 150. The spacer may perform a function of protecting a damage of the light emitting diode 140 which may be caused by a fine metal mask (FMM) used to pattern the organic light emitting layer 142.

The organic light emitting layer 142 is disposed on the anode 141 exposed by the bank layer 150. The organic light emitting layer 142 includes a hole injection layer, a hole transport layer, a light emitting layer, an electron transport layer, and an electron injection layer. The organic light emitting layer 142 may be configured with a single emission layer structure which emits single light or may be configured with a structure which is configured by a plurality of emission layers to emit white light.

The cathode 143 is disposed on the organic light emitting layer 142. When the display device 100 is a top emission type, the cathode 143 may be formed of a metal material having a small thickness and a high work function.

An encapsulation unit 160 is disposed on the cathode 143. The encapsulation unit 160 may protect the light emitting diode 140 from the moisture and oxygen. When the light emitting diode 140 is exposed to the moisture or oxygen, the pixel shrinkage phenomenon in which the light emitting diode 140 is shrunk is caused or a dark spot is generated in the emitting area.

For example, the encapsulation unit 160 includes a first inorganic encapsulation layer 161, an organic encapsulation layer 162 on the first inorganic encapsulation layer 161, and a second inorganic encapsulation layer 163 on the organic encapsulation layer 162. The first inorganic encapsulation layer 161 and the second inorganic encapsulation layer 163 are formed by inorganic insulating layers. For example, the first inorganic encapsulation layer 161 and the second inorganic encapsulation layer 163 may be formed of an inorganic insulating material such as silicon nitride (SiNx), silicon oxide (SiOx), silicon oxynitride (SiON), or aluminum oxide (Al2O3). The organic encapsulation layer 162 is formed as an organic insulating layer. The second inorganic encapsulation layer 163 covers upper surfaces and side surfaces of the first inorganic encapsulation layer 161 and the organic encapsulation layer 162. The second inorganic encapsulation layer 163 minimizes or blocks external moisture or oxygen from permeating the first inorganic encapsulation layer 161 and the organic encapsulation layer 162. At this time, the first inorganic encapsulation layer 161 and the second inorganic encapsulation layer 163 serve to block the permeation of moisture or oxygen and the organic encapsulation layer 162 serves to planarize an upper portion of the first inorganic encapsulation layer 161. However, a configuration of the encapsulation unit 160 is not limited thereto.

In the meantime, the touch panel TP is bonded onto the encapsulation unit 160 by the adhesive layer 170. The adhesive layer 170 is configured by an adhesive material to bond the encapsulation unit 160 and the touch panel TP. The adhesive layer 170 seals the light emitting diode 140 to protect the light emitting diode 140 from the permeation of the moisture or oxygen from the outside of the display device 100. As the adhesive layer 170, various materials may be used, and for example, various adhesive materials such as optical clear adhesive or optical clear resin may be used.

The touch panel TP corresponding to the active area AA of the display device 1000 includes a touch electrode TE disposed on a plurality of touch insulating layers 180.

The plurality of touch insulating layers 180 include a touch protection layer 181, a touch interlayer insulating layer 182 on the touch protection layer 181, a barrier layer 183 on the touch interlayer insulating layer 182, and a touch planarization layer 184 on the barrier layer 183.

The touch protection layer 181 is formed of an inorganic insulating material, and for example, formed of silicon oxide SiOx, silicon nitride SiNx, or a multilayer thereof. The touch protection layer 181 protects the touch electrode TE and the connection electrode CE disposed on the touch protection layer 181.

The connection electrode CE is disposed on the touch protection layer 181. The connection electrode CE is disposed in the intersection of the touch electrodes TE disposed in different directions to be used to connect the touch electrodes TE disposed in one direction. The connection electrode CE may be formed of a transparent conductive material and for example, formed of a transparent conductive oxide, such as ITO or IZO.

The touch interlayer insulating layer 182 may be disposed on the connection electrode CE and the touch protection layer 181. The touch interlayer insulating layer 182 insulates the connection electrode CE from the touch electrode TE. The touch interlayer insulating layer 182 may be formed of an organic insulating material, and for example, formed of an acryl, epoxy, or siloxane based material.

The barrier layer 183 is disposed so as to cover the touch electrode TE. The barrier layer 183 is formed of an inorganic film, and for example, formed of silicon oxide SiOx, silicon nitride SiNx, or a multilayer thereof. The barrier layer 183 suppresses the damage of the touch electrode TE caused by the moisture from the outside.

The touch planarization layer 184 is disposed on the barrier layer 183. The touch planarization layer 184 is disposed so as not to expose the barrier layer 183 to the outside to perform a substantially similar function to the substrate. The touch planarization layer 184 may be formed of an organic insulating material, and for example, formed of an acryl, epoxy, or siloxane based material.

Here, a cross-sectional structure of the non-active area NA of the display device 100 will be described in more detail with reference to FIG. 4.

Figure 4:
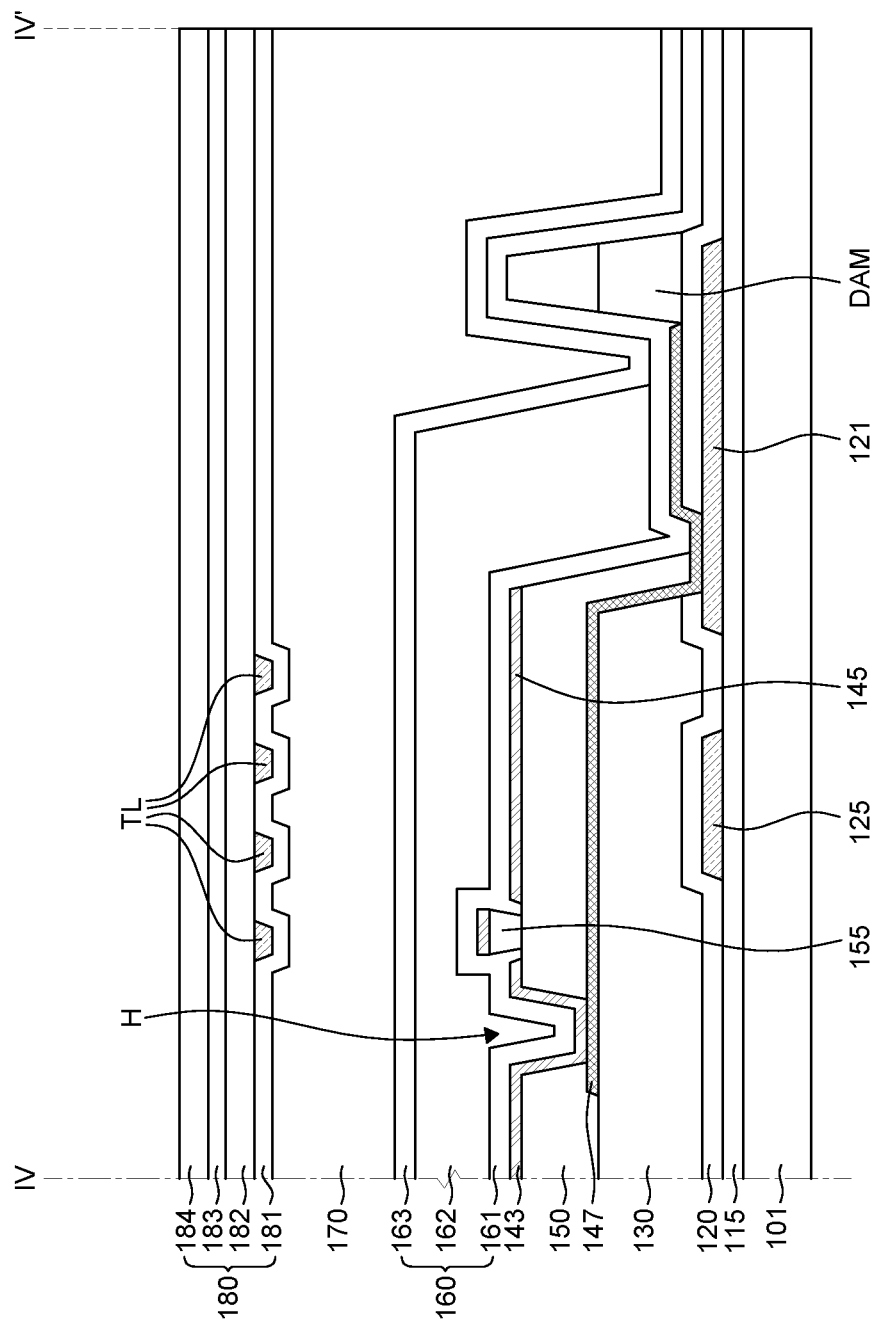
FIG. 4 is a schematic cross-sectional view taken along the line IV-IV' of FIG. 1.

FIG. 4 is a schematic cross-sectional view taken along the line IV-IV' of FIG. 1. Specifically, FIG. 4 is a cross-sectional view illustrating the non-active area NA of the display device 100.

As described with reference to FIG. 3, the transistor 110 for driving the display device 100 may be disposed on the substrate 101 corresponding to the active area AA and a driving circuit or a wiring line which generates or applies a signal for driving the display device 100 may be disposed on the substrate 101 corresponding to the non-active area NA.

In the non-active area NA, a gate driving circuit 125 which is connected to each pixel of the active area AA to output a signal for driving the pixel and a low potential voltage line 121 which is disposed to be closer to the outside of the substrate 101 than the gate driver circuit 125 and supplies a low potential driving voltage VSS to each pixel are disposed. Even though in FIG. 4, only some configurations of the gate driving circuit are illustrated as wiring lines for the convenience of illustration, various components such as a transistor, a capacitor, and a wiring line may be disposed in the gate driving circuit.

The interlayer insulating layer 120 is disposed on the gate driving circuit 125 and the low potential voltage line 121.

The planarization layer 130 is disposed on the interlayer insulating layer 120 overlapping the gate driving circuit 125 to planarize an upper portion thereof and the connection line 147 which is electrically connected to the low potential voltage line 121 is disposed on the planarization layer 130. The connection line 147 may be simultaneously formed of the same material as the anode 141 disposed in the active area AA.

A bank layer 150 including an opening H which exposes a partial area of the connection line 147 is formed on the connection line 147.

The cathode 143 which is in contact with the connection line 147 in the opening H is disposed on the bank layer 150.

In the meantime, the spacer 155 having an inverted tapered shape disposed to be closer to the outside of the substrate than the opening H is disposed on the bank layer 150. The spacer 155 is disposed to have an inverted tapered shape in which a width of a cross-section of an upper portion is larger than a width of a cross-section of a lower portion. Therefore, when the cathode 143 of the active area AA is disposed to extend to the non-active area NA, the cathode 143 may be disconnected by the spacer 155.

The shielding layer 145 which is disposed so as to overlap the gate driving circuit 125 is disposed on the bank layer 150. At this time, the shielding layer 145 may be simultaneously formed of the same material as the cathode 143.

Specifically, referring to FIGS. 1 to 4 together, in the display device 100 according to the exemplary embodiment of the present disclosure, the cathode 143 may be formed of one metal layer so as to cover both the active area AA and the non-active area NA. For example, the metal layer may be formed of metal having a high work function, but is not limited thereto.

However, the spacer 155 has an inverted tapered shape in which a width of the cross-section of the upper portion of the spacer 155 disposed on the bank layer 150 is larger than a width of the cross-section of the lower portion so that the cathode 143 formed as one metal layer may be separated from the upper portion of the spacer 155. For example, the cathode 143 may be manufactured using one metal layer and at this time. At this time, a part of the metal layer is disconnected by the spacer 155 to form the cathode 143 and the shielding layer 145 which is located on the bank layer 150 and is electrically separated from the cathode 143.

To be more specific, when a metal layer for forming the cathode 143 on the bank layer 150 and the spacer 155 is deposited, the metal layer is separated due to the inverted tapered structure of the spacer 155. That is, the metal layer is laminated on an upper surface of the spacer 155, but is not formed on the side surface of the spacer 155 so that the cathode 143 and the shielding layer 145 may be disconnected. Accordingly, the metal layer disposed toward the inside of the substrate 101 from the spacer 155 configures the cathode 143 and the metal layer disposed toward the outside of the substrate 101 from the spacer 155 configures the shielding layer 145. Therefore, the shielding layer 145 and the cathode 143 are electrically separated and to be more specific, the shielding layer 145 may be disconnected from the cathode 143 by the spacer 155. In the meantime, the metal layer disposed on the upper surface of the spacer is also referred to as the shielding layer 145.

Therefore, the shielding layer 145 is disposed on the bank layer 150 to be closer to the outside of the substrate 101 than the opening H and to be more specific, the shielding layer 145 is disposed to be closer to the outside of the substrate 101 than the spacer 155 and is disposed to extend to an outermost periphery of the upper surface of the bank layer 150.

By doing this, besides the signal generated when the connection line 147 is in contact with the cathode 143, the influence of a signal generated at the outside, that is, in a portion closer to the outside of the substrate 101 than the spacer 155 on the cathode 143 may be shielded.

Further, the shielding layer 145 is disposed so as to overlap the gate driving circuit 125 to shield a noise signal generated from the outside so as not to be transmitted to the gate driving circuit 125, thereby suppressing a parasitic capacitance formed between signals generated in the gate driving circuit 125 and an external component.

In the meantime, the encapsulation unit 160 including the first inorganic encapsulation layer 161, the organic encapsulation layer 162, and the second inorganic encapsulation layer 163 is disposed on the cathode 143 and the shielding layer 145.

The encapsulation unit 160 covers both the active area AA and the non-active area NA of the substrate 101 and suppresses the permeation of the moisture and oxygen into the display device 100.

A dam DAM which blocks the flow of the organic encapsulation layer 162 which configures the encapsulation unit 160 may be disposed in the non-active area NA. Specifically, the dam DAM is disposed in the non-active area NA to block the flow of the organic encapsulation layer 162 which configures the encapsulation unit 160. The dam DAM needs to be formed with a predetermined height or higher to block the flow of the organic encapsulation layer 162. To this end, the dam DAM may be formed of at least one or more layers formed of an organic material. For example, the dam DAM may include a lower layer formed of the same material as the planarization layer 130 and an upper layer formed of the same material as the bank layer 150, but is not limited thereto. Even though in the drawing, one dam DAM is illustrated, two or more dams DAM may be provided.

The touch panel TP is bonded onto the encapsulation unit 160 by the adhesive layer 170.

The touch panel TP corresponding to the non-active area AA of the display device 1000 includes a touch routing line TL disposed on a plurality of touch insulating layers 180.

Each of the plurality of touch routing lines TL electrically connects each of the plurality of touch electrodes TE disposed in the active area AA and the touch pad PAD of the non-active area NA. For example, a touch driving signal is applied to the first touch electrode TE1 by means of a touch routing line TL connected to the first touch electrode TE1 and a touch sensing signal is transmitted to the second touch electrode TE2 by means of a touch routing line TL connected to the second touch electrode TE2.

When the plurality of touch routing lines TL intersect, in the intersections of the plurality of touch routing lines TL by means of the connection line CL, the plurality of touch routing lines TL may be connected, but is not limited thereto.

In the related art, a signal of the gate driving circuit disposed in the display panel and a signal of the touch routing line interfere with each other so that a parasitic capacitance is generated between the gate driving circuit and the touch routing line. In order to overcome this problem, in the display device of the related art, the gate driving circuit and the touch routing line are disposed to be spaced apart from each other so as not to overlap each other. However, when the gate driving circuit and the touch routing line are disposed as described above, an area of the non-active area is increased so that consequently, the bezel is increased.

Accordingly, in the display device according to the exemplary embodiment of the present disclosure, the shielding layer 145 is disposed between the gate driving circuit 125 and the touch routing line TL to shield the signal interference which may be generated between the gate driving circuit 125 and the touch routing line TL and reduce a bezel size.

Specifically, the shielding layer 145 is disposed between the gate driving circuit 125 and the touch routing line IL to shield the influence of the signal caused by the touch routing line TL on the gate driver 124 located in a lower stage of the shielding layer 145. In contrast, the shielding layer 145 may shield the influence of the signal caused by the gate driver 124 on the touch routing line TL located in an upper stage of the shielding layer 145.

That is, the shielding layer 145 is disposed between the gate driving circuit 125 and the touch routing line TL to suppress the parasitic capacitance caused by the interference of the signal generated in the gate driving circuit 125 and the signal generated in the touch routing line TL.

Accordingly, in the display device 100 according to the exemplary embodiment of the present disclosure, even though the gate driving circuit 125 and the touch routing line TL are disposed to overlap, the parasitic capacitance generated between the gate driving circuit 125 and the touch routing line TL may be blocked by the shielding layer 145. Accordingly, in the display device 100 according to the exemplary embodiment of the present disclosure, not only the parasitic capacitance is reduced, but also the area of the non-active area NA is reduced by disposing the touch routing line TL so as to overlap the gate driving circuit 125. As a result, a size of the bezel of the display device 100 may be reduced.

Figure 5:
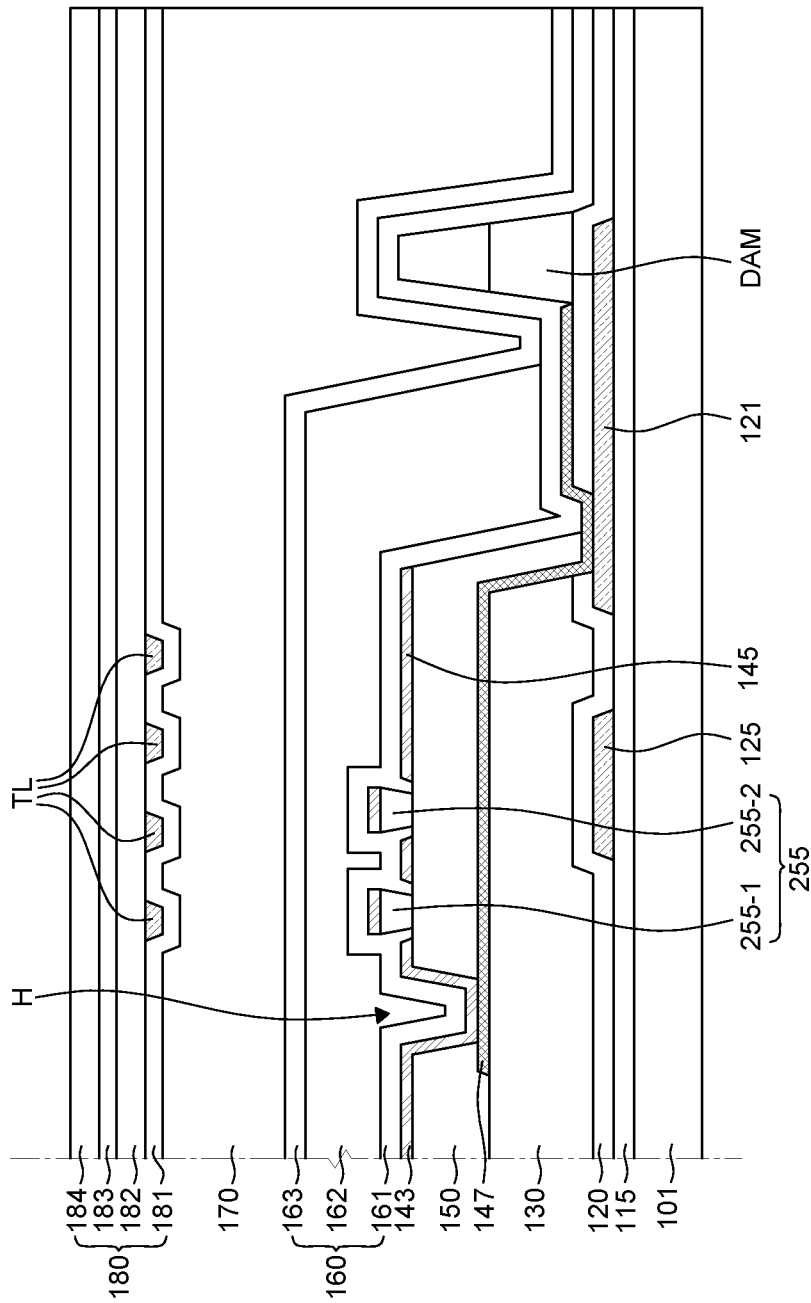
FIG. 5 is a schematic cross-sectional view of a display panel according to another exemplary embodiment of the present disclosure.

FIG. 5 is a schematic cross-sectional view of a display device 200 according to another exemplary embodiment of the present disclosure. Specifically, FIG. 5 is a cross-sectional view illustrating the non-active area NA of the display device 200. The display device 200 illustrated in FIG. 5 is substantially the same as the display device 100 illustrated in FIGS. 1 to 4 except that a double spacer 255 is configured, so that a redundant description will be omitted.

Referring to FIG. 5, the display device 200 according to another exemplary embodiment of the present disclosure includes a first spacer 255-1 disposed on the bank layer 150 adjacent to the opening H and a second spacer 255-2 disposed closer to the outside of the substrate 101 than the first spacer 255-1.

As described above, the spacer has an inverted tapered shape in which a width of the cross-section of the upper portion of the spacer 255 disposed on the bank layer 150 is larger than a width of the cross-section of the lower portion so that the cathode 143 formed as one metal layer may be separated on the upper portion of the spacer 255. At this time, a protruding length of the side surface of the spacer 255 from the lower surface of the spacer 255 and a height of the spacer 255 are controlled to separate the cathode 143. At this time, when only one spacer 255 is provided, there may be a problem in that the metal layer is not completely separated from the cathode 143 and the shielding layer 145, but may be electrically connected. Accordingly, in order to electrically separate the metal layer from the cathode 143 and the shielding layer 145 completely, at least two spacers 255 may be provided.

When at least two spacers 255 are included, even though the touch routing line TL overlaps at least any one of the first spacer 255-1 and the second spacer 255-2, the shielding layer 145 and the cathode 143 are electrically separated by the spacer 255 so that the influence of the signal caused by the touch routing line TL on the cathode 143 may be shielded.

The exemplary embodiments of the present disclosure can also be described as follows:

According to an aspect of the present disclosure, a display device, comprising: a substrate which includes an active area including a plurality of pixels and a non-active area which is located to enclose the active area and has a gate driving circuit connected to each pixel; a low potential voltage line which is disposed to be closer to an outside of the substrate than the gate driving circuit; a connection line which is disposed on the gate driving circuit and is electrically connected to the low potential voltage line; a bank layer which is disposed on the connection line and includes an opening which exposes a partial area of the connection line; a cathode which is disposed on the bank layer and is in contact with the connection line in the opening; a spacer having an inverted tapered shape which is disposed on the bank layer to be closer to the outside of the substrate than the opening; and a shielding layer which is disposed so as to overlap the gate driving circuit on the bank layer.

The display device further comprising an encapsulation unit which is disposed on the cathode, the spacer, and the shielding layer; and a touch panel disposed on the encapsulation unit, wherein the touch panel includes a touch electrode disposed in the active area and a touch routing line which is connected to the touch electrode and is disposed in the non-active area and the touch routing line may overlap the shielding layer.

The shielding layer may be formed of the same material as the cathode.

The shielding layer may be disposed to be closer to the outside of the substrate than the spacer.

The shielding layer and the cathode may be electrically separated.

The shielding layer may be isolated from the cathode by the spacer.

The shielding layer may be disposed so as to extend to an outermost periphery of an upper surface of the bank layer.

The touch panel is disposed on a plurality of touch insulating layers to be bonded onto the encapsulation layer by an adhesive layer.

The plurality of touch insulating layers may include a touch protection layer, a touch interlayer insulating layer on the touch protection layer, a barrier layer on the touch interlayer insulating layer, and a touch planarization layer on the barrier layer.

The spacer may include a first spacer disposed on the bank layer adjacent to the opening; and a second spacer which is disposed to be closer to the outside of the substrate than the first spacer.

The touch routing line may overlap at least any one of the first spacer and the second spacer.

According to another aspect of the present disclosure, a substrate which includes an active area including a plurality of pixels and a non-active area which is located to enclose the active area and has a gate driving circuit connected to each pixel; a bank layer which is disposed on the active area and the non-active area and defines the plurality of pixels on the active area; a cathode formed on the plurality of pixels and the bank layer; a spacer having an inverted tapered shape formed on the bank layer of the non-active area; and a shielding layer which is formed by apart of the cathode isolated by the spacer to be formed on the bank layer of the non-active area.

The shielding layer may overlap the gate driving circuit.

The display device may further comprise a touch electrode disposed on the active area; and a touch routing line which is connected to the touch electrode and is formed on the shielding layer to overlap the shielding layer.

The cathode and the shielding layer may be electrically separated.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate which includes an active area including a plurality of pixels and a non-active area which encloses the active area and has a gate driving circuit connected to each pixel;
    a low potential voltage line which is disposed closer to an outside of the substrate than the gate driving circuit;
    a connection line which is disposed on the gate driving circuit and is electrically connected to the low potential voltage line;
    a bank layer which is disposed on the connection line and includes an opening which exposes a partial area of the connection line;
    a cathode which is disposed on the bank layer and is in contact with the connection line in the opening;
    a spacer having an inverted tapered shape which is disposed on the bank layer to be closer to the outside of the substrate than the opening; and
    a shielding layer which overlaps the gate driving circuit on the bank layer.

2. The display device according to claim 1, wherein the shielding layer is formed of the same material as the cathode.

3. The display device according to claim 1, wherein the shielding layer and the cathode are electrically separated.

4. The display device according to claim 1, wherein the shielding layer extends to an outermost periphery of an upper surface of the bank layer.

5. The display device according to claim 1, wherein a width of a cross-section of an upper portion of the spacer is larger than a width of the cross-section of a lower portion of the spacer so that the cathode is separated from the upper portion of the spacer.

6. The display device according to claim 1, further comprising:
    an encapsulation unit which is disposed on the cathode, the spacer, and the shielding layer; and
    a touch panel disposed on the encapsulation unit,
    wherein the touch panel includes a touch electrode disposed in the active area and a touch routing line which is connected to the touch electrode and is disposed in the non-active area, the touch routing line overlapping the shielding layer.

7. The display device according to claim 6, wherein the shielding layer is disposed between the gate driving circuit and the touch routing line.

8. The display device according to claim 6, further comprising an adhesive layer and a plurality of touch insulating layers, wherein the touch panel is disposed on the plurality of touch insulating layers and bonded onto the encapsulation layer by the adhesive layer.

9. The display device according to claim 8, wherein the plurality of touch insulating layers include a touch protection layer, a touch interlayer insulating layer on the touch protection layer, a barrier layer on the touch interlayer insulating layer, and a touch planarization layer on the barrier layer.

10. The display device according to claim 1, wherein the shielding layer is disposed to be closer to the outside of the substrate than the spacer.

11. The display device according to claim 10, wherein the shielding layer is isolated from the cathode by the spacer.

12. The display device according to claim 1, wherein the spacer includes:
    a first spacer disposed on the bank layer adjacent to the opening; and
    a second spacer which is disposed closer to the outside of the substrate than the first spacer.

13. The display device according to claim 12, further comprising:
    an encapsulation unit which is disposed on the cathode, the spacer, and the shielding layer; and
    a touch panel disposed on the encapsulation unit,
    wherein the touch panel includes a touch electrode disposed in the active area and a touch routing line which is connected to the touch electrode and is disposed in the non-active area and the touch routing line overlaps the shielding layer.

14. The display device according to claim 13, wherein the touch panel further includes a plurality of touch pads disposed in the non-active area.

15. The display device according to claim 13, wherein the touch routing line overlaps at least any one of the first spacer and the second spacer.

16. A display device, comprising:
a substrate which includes an active area including a plurality of pixels and a non-active area which encloses the active area and has a gate driving circuit connected to each pixel;
a bank layer which is disposed on the active area and the non-active area and defines the plurality of pixels on the active area;
a cathode formed on the plurality of pixels and the bank layer;
a spacer having an inverted tapered shape formed on the bank layer of the non-active area; and
a shielding layer which is formed by a part of the cathode isolated by the spacer to be formed on the bank layer of the non-active area.

17. The display device according to claim 16, wherein the shielding layer overlaps the gate driving circuit.

18. The display device according to claim 16, further comprising:
a touch electrode disposed on the active area; and
a touch routing line which is connected to the touch electrode and is formed on the shielding layer to overlap the shielding layer.

19. The display device according to claim 16, wherein the cathode and the shielding layer are electrically separated.

* * * * *